(12) United States Patent
Kajiyama et al.

(10) Patent No.: US 9,779,652 B2
(45) Date of Patent: Oct. 3, 2017

(54) DISPLAY DEVICE

(71) Applicant: Japan Display Inc., Tokyo (JP)

(72) Inventors: Kenta Kajiyama, Tokyo (JP);
Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 12 days.

(21) Appl. No.: 14/939,644

(22) Filed: Nov. 12, 2015

(65) Prior Publication Data

US 2016/0141341 A1   May 19, 2016

(30) Foreign Application Priority Data

Nov. 13, 2014   (JP) .................................. 2014-230626

(51) Int. Cl.
*H01L 27/32* (2006.01)
*G09G 3/30* (2006.01)

(52) U.S. Cl.
CPC ........... *G09G 3/30* (2013.01); *H01L 27/3279* (2013.01); *G09G 2300/0426* (2013.01); *H01L 27/3213* (2013.01); *H01L 27/3276* (2013.01)

(58) Field of Classification Search
None
See application file for complete search history.

(56) References Cited

U.S. PATENT DOCUMENTS

| | | | |
|---|---|---|---|
| 2007/0194699 A1* | 8/2007 | Lee ..................... | H01L 27/3276 313/505 |
| 2007/0241664 A1* | 10/2007 | Sakamoto ........... | H01L 27/3276 313/503 |
| 2010/0033089 A1 | 2/2010 | Nakamura et al. | |
| 2013/0050282 A1* | 2/2013 | Kim ..................... | G09G 3/3413 345/690 |

FOREIGN PATENT DOCUMENTS

| JP | 2007-287354 A | 11/2007 |
|---|---|---|
| JP | 2010-044894 A | 2/2010 |

* cited by examiner

*Primary Examiner* — Hoang-Quan Ho
(74) *Attorney, Agent, or Firm* — Typha IP LLC

(57) ABSTRACT

A sub-pixel is provided in a display area of an organic EL display device. A bank layer surrounds an outer periphery of the sub-pixel. A contact area is positioned in the display area and is adjacent to the sub-pixel through the bank layer. A pixel electrode is provided in the sub-pixel. A common electrode is disposed across the sub-pixel and the contact area. At least a part of an auxiliary conductive layer is positioned in the contact area. A contact hole is provided in the contact area and electrically connects the common electrode and the auxiliary conductive layer.

18 Claims, 6 Drawing Sheets

DISPLAY DEVICE

CROSS-REFERENCE TO RELATED APPLICATION

The present application claims priority from Japanese application JP2014-230626 filed on Nov. 13, 2014, the content of which is hereby incorporated by reference into this application.

BACKGROUND OF THE INVENTION

1. Field of the Invention

The present invention relates to a display device.

2. Description of the Related Art

An organic EL display device includes a pixel electrode disposed in each of pixels and a common electrode disposed across the plural pixels, and an organic layer including a light-emitting layer is disposed between those electrodes. In general, the material of the common electrode has a large electric resistance. Thus, as a distance from a terminal becomes large, the electric potential of the common electrode decreases, and brightness in a display area is gradually reduced.

JP 2007-287354 A discloses that an auxiliary electrode is provided between two adjacent pixels in order to suppress reduction of the electric potential of a common electrode. JP 2010-044894 A discloses that a common electrode and an auxiliary wiring formed in a layer lower than the common electrode are connected between two adjacent pixels.

SUMMARY OF THE INVENTION

As the resolution of an organic EL display device increases, the interval between two adjacent pixels becomes narrow. Thus, in the organic EL display device, a structure for suppressing the decrease in the electric potential of a common electrode is difficult to be provided between two adjacent pixels.

The invention has an object to provide a display device capable of uniformizing the electric potential of a common electrode and achieving high resolution.

According to the invention, a display device includes a first pixel positioned in a display area, a bank layer surrounding an outer periphery of the first pixel, a contact area positioned in the display area and adjacent to the first pixel through the bank layer, a pixel electrode provided in the first pixel, a common electrode disposed across the first pixel and the contact area, an auxiliary conductive layer at least a part of which is positioned in the contact area, and a contact hole provided in the contact area and electrically connecting the common electrode and the auxiliary conductive layer. According to this, the uniformization of the electric potential of the common electrode and the high resolution can be realized.

DETAILED DESCRIPTION OF THE INVENTION

Figure 1:
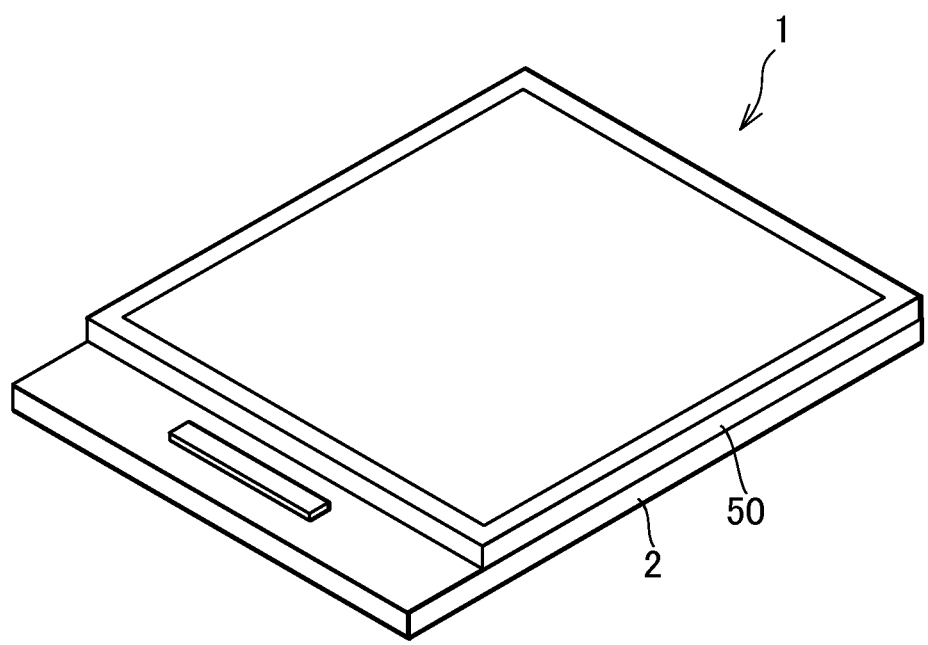
FIG. 1 is a perspective view of a display device according to an embodiment of the invention.

Hereinafter, a mode (hereinafter called an embodiment) for carrying out the invention will be described. Incidentally, the disclosure of the specification is merely an example of the invention, and suitable modifications within the sprit of the invention and easily conceivable by a skilled person in the art fall within the scope of the invention. Besides, widths, thicknesses, shapes and the like of respective parts shown in the drawings are schematically shown, and do not restrict the interpretation of the invention. Besides, in the embodiment, although a description is made on a case where a display device is an organic EL display device, the invention may be applied to a display device other than the organic EL display device.

[1. Outer Appearance of Organic EL Display Device]

FIG. 1 is a perspective view of an organic EL display device 1 according to an embodiment of the invention. The organic EL display device 1 includes a TFT (Thin Film Transistor) substrate 2 and an opposite substrate 50 opposite thereto.

[2. Layout of Pixels]

Figure 2:
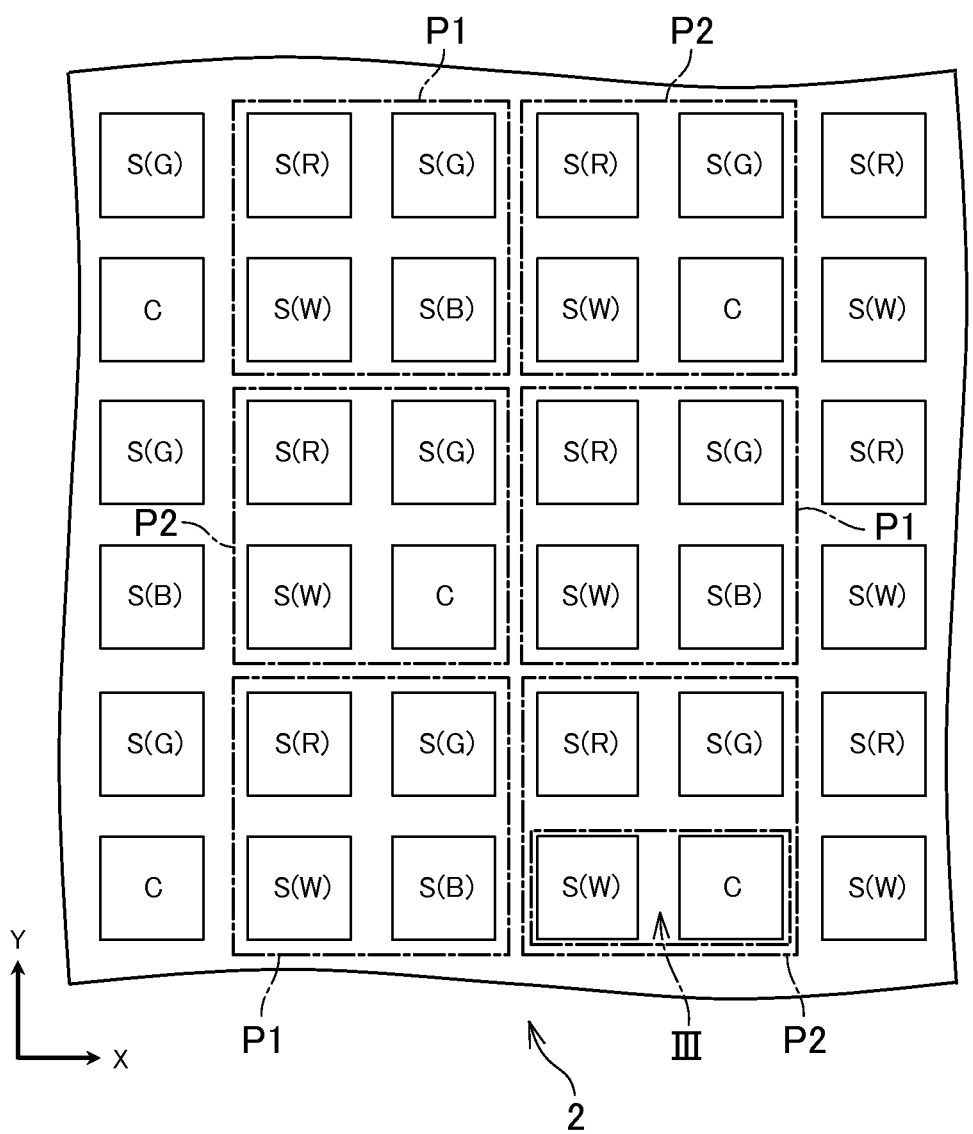
FIG. 2 is a plan view showing an example of a layout of pixels in a TFT substrate.

FIG. 2 is a plan view showing an example of a layout of main pixels in the TFT substrate 2. As shown in FIG. 2, the TFT substrate 2 includes a display area for displaying an image, and plural main pixels P1 and P2 are provided in the display area. The respective main pixels P1 and P2 are arranged in a horizontal direction (X-direction in FIG. 2) and a vertical direction (Y-direction in FIG. 2).

The main pixel P1 includes at least three sub-pixels (hereinafter called also sub-pixels S or simply "pixels") to emit lights of different colors. In the embodiment, the main pixel P1 includes a red sub-pixel S (R) to emit red light, a green sub-pixel S (G) to emit green light, a blue sub-pixel S (B) to emit blue light, and a white sub-pixel S (W) to emit white light. Incidentally, the main pixel P1 may include three sub-pixels not including the white sub-pixel S (W).

Besides, the main pixel P2 includes at least two sub-pixels S and a contact area C where a common electrode 33 described later is electrically connected to an auxiliary conductive layer 12 described later. More specifically, the main pixel P2 includes the contact area C instead of one of the at least three sub-pixels S included in the main pixel P1.

In the embodiment, the main pixel P2 includes the contact area C instead of the blue sub-pixel S (B). In general, even if some blue sub-pixels S (B) displayed in the display area are missing, since visibility of blue is low, a user of the organic EL display device 1 can not visually recognize. Thus, even if the contact area C is provided instead of the blue sub-pixel S (B), and the pixel is removed in order to provide the contact area C, the reduction in display picture quality can be suppressed. Incidentally, the pixel to be removed in order to provide the contact area C is not limited to the blue sub-pixel S (B), but may be any one of the red sub-pixel S (R), the green sub-pixel S (G) and the white sub-pixel S (W).

[3. Sub-pixel and Contact Area]

Figure 3:
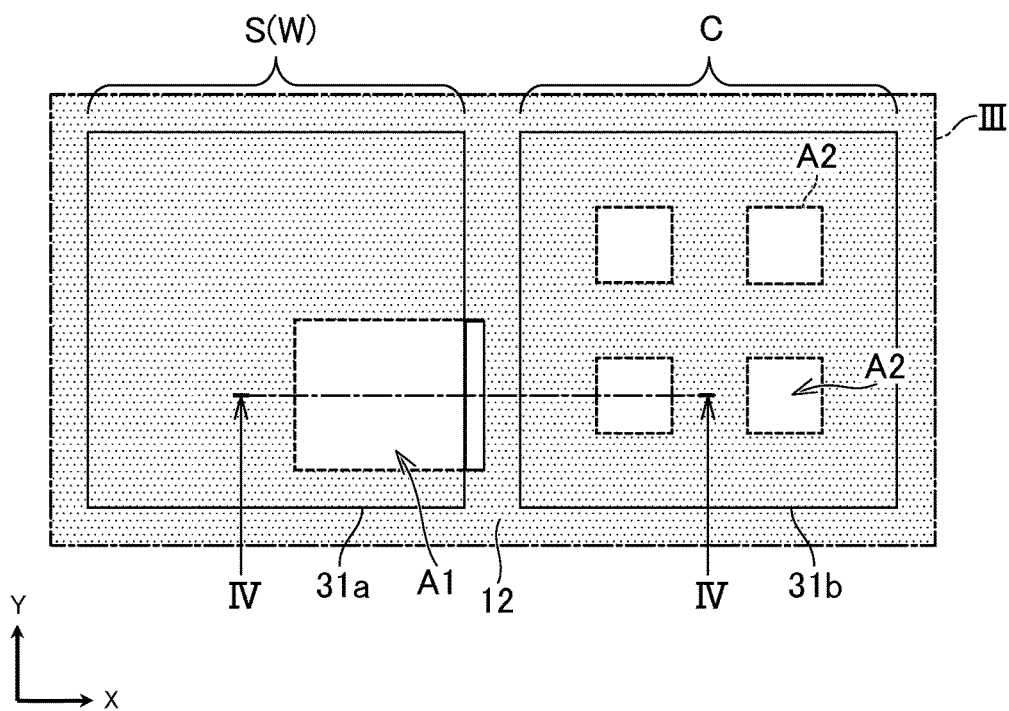
FIG. 3 is a plan view showing an example of a layout of an auxiliary conductive layer, a pixel electrode and a conductive part.
Figure 4:
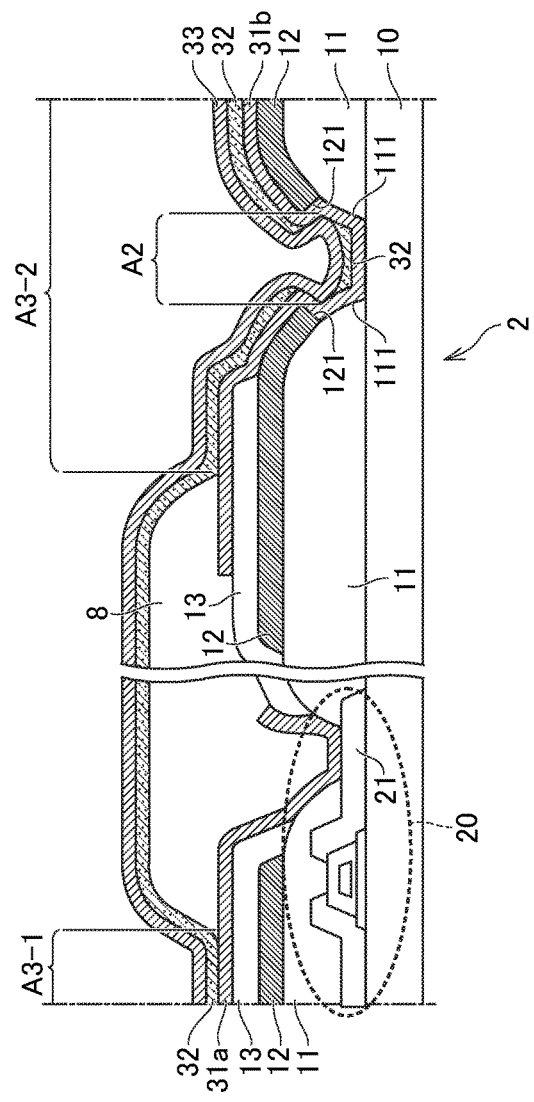
FIG. 4 is a sectional view showing an example of a sub-pixel and a contact area.

FIG. 3 is a plan view showing an example of a layout of an auxiliary conductive layer, a pixel electrode and a conductive part in the sub-pixel S and the contact area C of the pixel P2, and is a view showing the details in line III of FIG. 2. FIG. 4 is a sectional view showing an example of a section of the TFT substrate 2 (specifically, the sub-pixel S and the contact area C), and the cross section is indicated by line IV-IV of FIG. 3.

As shown in FIG. 3 and FIG. 4, a pixel electrode 31a made of a conductive material such as ITO (Indium Tin Oxide) or IZO (Indium Zinc Oxide) is formed in each sub-pixel S. Besides, a conductive part 31b made of a conductive member is formed in each contact area C. In the embodiment, the conductive part 31b is formed in the same layer as the pixel electrode 31a and of the same material as the pixel electrode 31a. That is, the conductive member formed in the whole display area is processed (for example, etching-processed) to be separated between the sub-pixel S and the contact area C, and becomes the pixel electrode 31a and the conductive part 31b. As shown in FIG. 3, the conductive part 31b of the contact area C is formed at a position corresponding to the pixel electrode 31a of the sub-pixel S. Incidentally, the pixel electrode 31a may be formed by sputtering. Besides, when the TFT substrate 2 is of a top emission type, the pixel electrode 31a and the conductive part 31b may contain a material reflecting light, such as Ag.

Besides, the auxiliary conductive layer 12 made of a conductive material such as Al or Mo is formed in the display area except part of the sub-pixel S and the contact area C. In other words, at least a part of the auxiliary conductive layer 12 is positioned in the contact area C. An insulating layer 13 for breaking the electrical connection to the pixel electrode 31a is formed under the auxiliary conductive layer 12. As stated above, the auxiliary conductive layer 12 and the insulating layer 13 are disposed across the sub-pixel S and the contact area C. Incidentally, in the sub-pixel S and in a place where the auxiliary conductive layer 12 and the insulating layer 13 are removed (for example, in a rectangular area A1 except a half-tone dot meshing portion of FIG. 3), the pixel electrode 31a is connected to a drive wiring 21 of a circuit part 20 described later.

A contact hole A2 described later is formed in an area of the contact area C. Incidentally, although FIG. 3 shows an example in which four contact holes A2 are formed in one contact area C, the number of the contact holes A2 formed in the contact area C may be one or may be two or more other than four.

Besides, as shown in FIG. 4, the TFT substrate 2 includes a substrate 10. The substrate 10 is, for example, a glass substrate or a resin substrate. The circuit part 20 to control image display is formed in the sub-pixel S in the display area of the TFT substrate 2. The circuit part 20 includes a TFT (Thin Film Transistor) and a capacitor, and controls current supply to the pixel electrode 31a formed in each sub-pixel S. More specifically, when the drive TFT included in the circuit part 20 is turned ON, current flows through the drive wiring 21 connected to the drive TFT, and the pixel electrode 31a, and an organic layer 32 described later, and the common electrode 33, the sub-pixel S emits light. Incidentally, the circuit part 20 may further include an auxiliary capacitor for increasing capacitance.

Besides, a flattening layer 11 as a second insulating layer for breaking the electrical connection between the circuit part 20 and the auxiliary conductive layer 12 is formed above (that is, in a direction separating from the surface of the TFT substrate 2 where the image area is formed) the circuit part 20 of the sub-pixel S. The auxiliary conductive layer 12 and the insulating layer 13 for breaking the electrical connection between the auxiliary conductive layer 12 and the pixel electrode 31a are formed above the flattening layer 11. In the sub-pixel S, the pixel electrode 31a is formed above these plural layers. The pixel electrode 31a is, for example, a conductive material film formed by sputtering in the whole area of the display area. Here, a hole (that is, a taper-shaped hole) having two side surfaces which face each other and whose interval becomes large upwardly is formed in the flattening layer 11 and at the place in contact with a part of the drive wiring 21. A part of the pixel electrode 31a enters this hole and contacts the drive wiring 21 of the circuit part 20. Incidentally, an inclined surface of the hole formed in the flattening layer 11 may be curved.

Besides, the organic layer 32 including a charge transport layer, a charge injection layer, a light-emitting layer and the like, and the common electrode 33 made of a conductive material, such as ITO or IZO, (transparent material when the TFT substrate 2 is of top emission type) are formed above the pixel electrode 31a of the sub-pixel S. The organic layer 32 is formed by, for example, evaporating plural layers in the whole area of the display area. The organic layer 32 may be constructed so that lights of colors corresponding to colors of the respective sub-pixels S are emitted (separately coloring system), or may be constructed so that for example, all the sub-pixels S emit lights of the same color (for example, white) (color filter system). In the color filter system, a color filter is formed on the opposite substrate 50. Besides, in the color filter system, the organic layer 32 may have a common layered structure disposed over all the sub-pixels S.

Besides, the TFT substrate 2 includes a bank layer 8 to partition the sub-pixel S and the contact area C adjacent to each other. That is, the bank layer 8 is disposed so as to surround the outer peripheries of the sub-pixel S and the contact area C. The bank layer 8 is formed above the flattening layer 11, the pixel electrode 31a and the conductive part 31b. Here, the display area except an area where the bank layer 8 is formed is a bank opening A3 (A3-1 and A3-2). In the sub-pixel S, the pixel electrode 31a is exposed in the bank opening A3, and the organic layer 32 contacts the pixel electrode 31a on the inside of the bank opening A3. When current flows through the pixel electrode 31a and the organic layer 32 and the common electrode 33, light is emitted from the inside of the bank opening A3-1 of the sub-pixel S.

The common electrode 33 is disposed across the plural main pixels P1 and P2, and covers the contact hole A2. The common electrode 33 is, for example, a conductive material film formed by sputtering in the whole area of the display area. Although the common electrode 33 contacts the organic layer 32 in the sub-pixel S, in the contact hole A2 of the contact area C, the common electrode 33 contacts the conductive part 31b formed in the same layer as the pixel electrode 31a and is electrically connected to the auxiliary conductive layer 12. Here, the resistance value of the material constituting the auxiliary conductive layer 12 is preferably lower than the resistance value of the material constituting the common electrode 33. For example, the auxiliary conductive layer 12 is made of a metal material such as Al or Mo.

As stated above, the common electrode 33 and the auxiliary conductive layer 12 are electrically connected, so that the whole electric resistance of the common electrode 33 is reduced, and electric potential gradient is suppressed. Besides, the contact area C is provided instead of the sub-pixel S. Thus, even if the interval between the main pixels P1 in the image area becomes small by increase in resolution, and for example, even if a connection place of the common electrode 33 and the auxiliary conductive layer 12 can not be formed between the adjacent main pixels P1, the connection between the common electrode 33 and the auxiliary conductive layer 12 can be secured. Incidentally, a specified electric potential (common potential) may be applied to the common electrode 33. In this case, the specified electric potential is applied also to the auxiliary conductive layer 12 electrically connected to the common electrode 33.

[4. Contact Hole]

The contact hole A2 according to the embodiment will be described. The contact hole A2 is formed of a taper-shaped hole (opening) of the flattening layer 11 in the contact area C. The inclined surface of the taper-shaped hole (opening) may be curved. Besides, as shown in FIG. 4, an opening is formed in the auxiliary conductive layer 12 so as to avoid the hole of the flattening layer 11. An edge of the opening of the auxiliary conductive layer 12 is positioned on two side surfaces 111 of the hole of the flattening layer 11. That is, the contact hole A2 may be regarded as being formed of the hole of the flattening layer 11 and the opening of the auxiliary conductive layer 12. Besides, since the auxiliary conductive layer 12 is disposed as stated above, inside side surfaces 121 (end side surfaces of the auxiliary conductive layer 12 shown in FIG. 4) of the contact hole A2 are formed in a reverse taper shape in which the width is inclined to gradually become small upwardly. As shown in FIG. 4, the conductive part 31b covers the side surfaces 111 and the side surfaces 121 of the contact hole A2 and is disposed in the contact hole A2. Besides, the conductive part 31b includes a portion formed in a reverse taper following the side surfaces 121, and is electrically connected to the common electrode 33 at the portion.

As stated above, the reverse taper can be easily formed by using the thickness of the auxiliary conductive layer 12. Incidentally, the size and angle of the reverse taper are determined according to the thickness of the auxiliary conductive layer 12 and the steepness of the inclined surface of the flattening layer 11. For example, when the flattening layer 11 is steep, the angle of the reverse taper also becomes steep. The steepness of the inclined surface of the flattening layer 11 is determined according to the heating temperature and time at the formation of the flattening layer 11 and the roughness degree of the contact hole A2. For example, as the number of the contact holes A2 in the sub-pixel S having a specified area becomes large, the roughness degree of the contact hole A2 also becomes large, and the angle of the inclined surface of the flattening layer 11 becomes steep.

Besides, the edge of the opening of the auxiliary conductive layer 12 in the contact hole A2 is covered with the conductive part 31b formed in the same layer as the pixel electrode 31a. Incidentally, the contact hole A2 has only to be such that the common electrode 33 and the auxiliary conductive layer 12 are electrically connected, and the conductive part 31b may not be provided theoretically. However, for example, when a conductive material layer (specifically, a layer constituting the pixel electrode 31a and the conductive part 31b) is formed in the whole display area by a sputtering process, and the conductive material layer is removed by an etching process, not only the conductive material layer but also the auxiliary conductive layer 12 formed thereunder is also influenced by etching solution. Thus, in the embodiment, the conductive material layer, that is, the conductive part 31b is made to remain in order to protect the auxiliary conductive layer 12 from the etching solution.

Besides, the organic layer 32 is broken in a portion where the reverse taper of the contact hole A2 is formed. Since the common electrode 33 contacts the conductive part 31b at the place where the organic layer 32 is broken, the common electrode 33 and the auxiliary conductive layer 12 can be electrically connected.

As described above, the contact area C is provided instead of the blue sub-pixel S (B) in the main pixel P2 of the embodiment. Hereby, even if the resolution of the display area of the TFT substrate 2 is increased, the electric potential of the common electrode 33 can be kept uniform.

Besides, since the reverse taper is formed in the contact hole A2 of the contact area C, the common electrode 33 and the auxiliary conductive layer 12 can be electrically connected.

[5. Modified Examples]

Incidentally, the invention is not limited to the embodiment described above, but may be variously modified. Hereinafter, examples (modified examples) of the other mode for carrying out the invention will be described.

Figure 5:
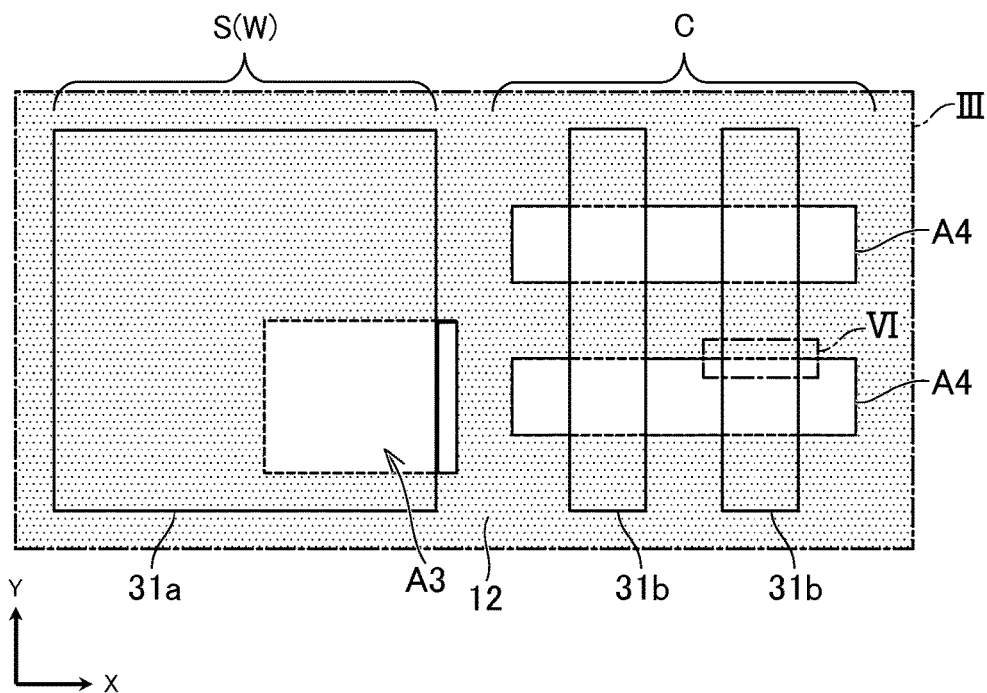
FIG. 5 is a plan view showing an example of a layout of an auxiliary conductive layer, a pixel electrode and a conductive part.

(1) FIG. 5 is a plan view showing a modified example of a layout of an auxiliary conductive layer 12, a pixel electrode 31a and a conductive part 31b of a sub-pixel S and a contact area C in a pixel P2. In plan view of FIG. 5, an edge of an opening (that is, a contact hole A4) of the auxiliary conductive layer 12 extends in an X-axis direction, and the conductive part 31b formed in the same layer as the pixel electrode 31a extends in a Y-axis direction. When the contact hole A4 is formed as stated above, an organic layer 32 is apt to be broken at a portion where the edge of the contact hole A4 crosses the conductive part 31b. Thus, a common electrode 33 is apt to contact the portion crossing the contact hole A4.

Figure 6:
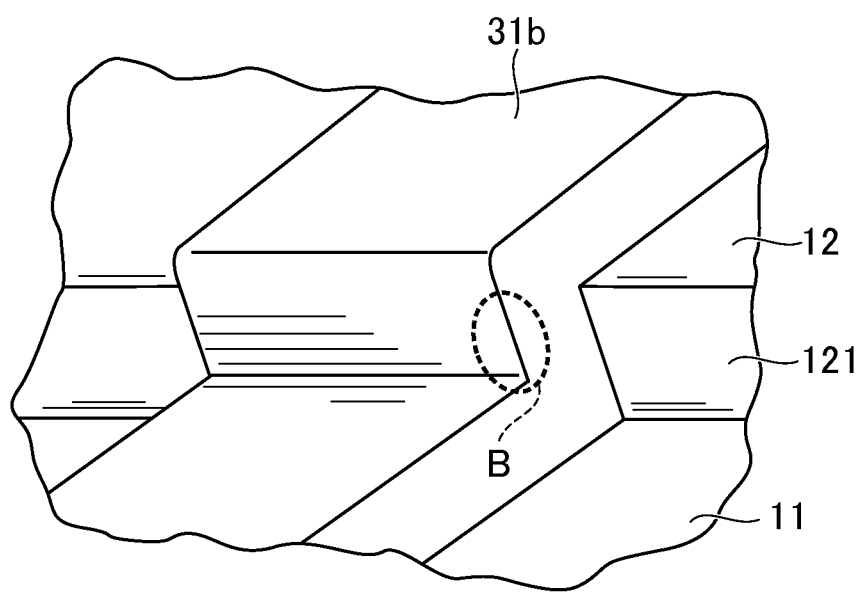
FIG. 6 is a perspective view showing an example of a contact hole.

FIG. 6 is a perspective view showing the details of the contact hole A4 in line VI of FIG. 5. In the conductive part 31b shown in FIG. 6 and in the vicinity (for example, an area B in FIG. 6) of an edge of a portion crossing the edge of the auxiliary conductive layer 12, the organic layer 32 is apt to be broken, and accordingly, the common electrode 33 is apt to contact.

(2) Besides, although the auxiliary conductive layer 12 contacts the common electrode 33 and contributes to the reduction of electric resistance of the common electrode 33, an auxiliary capacitor for stabilizing the voltage of a drive TFT included in the circuit part 20 may be formed in the auxiliary conductive layer 12. In this case, the auxiliary conductive layer 12 may be formed to be separated between the sub-pixel S and the contact area C.

(3) Besides, the contact hole A2 may not be necessarily formed in the reverse taper. That is, the common electrode 33 and the conductive part 31b have only to contact each other in the contact hole A2, and for example, the organic layer 32 may be formed so as to avoid the contact hole A2.

(4) Besides, in the embodiment, although the description is made on the case where the blue sub-pixel S (B) is removed in order to provide the contact area C, the color of the sub-pixel S to be removed is not limited to blue. Incidentally, the color of the sub-pixel S to be removed is preferably the color whose visibility is lower than the color of the other sub-pixel S. Besides, the pixel S to be removed in order to provide the contact area C may be selected according to a specified rule or may be selected randomly.

While there have been described what are at present considered to be certain embodiments of the invention, it will be understood that various modifications may be made thereto, and it is intended that the appended claim cover all such modifications as fall within the true spirit and scope of the invention.

What is claimed is:

1. A display device comprising:
   a substrate;
   a first pixel positioned in a display area;
   a bank layer surrounding an outer periphery of the first pixel;
   a contact area adjacent to the first pixel through the bank layer, a whole of the contact area positioned in the display area;
   a pixel electrode provided in the first pixel;
   a common electrode disposed across the first pixel and the contact area;
   an auxiliary conductive layer at least a part of which is positioned in the contact area; and
   a contact hole provided in the contact area and electrically connecting the common electrode and the auxiliary conductive layer;
   a thin film transistor provided on the substrate, provided in the first pixel and connected to the pixel electrode; and
   an insulating layer covering the thin film transistor and disposed across the first pixel and the contact area, wherein
   the auxiliary conductive layer is disposed on an opposite side of the insulating layer from the substrate,
   the contact hole includes an opening of the insulating layer and an opening of the auxiliary conductive layer, and
   the common electrode covers the contact hole.

2. The display device according to claim 1, wherein
   the contact area includes a conductive part provided in a same layer as the pixel electrode,
   the conductive part covers the contact hole and contacts the auxiliary conductive layer, and
   the common electrode and the auxiliary conductive layer are electrically connected through the conductive part.

3. The display device according to claim 2, wherein
   an edge of the opening of the auxiliary conductive layer extends in a first direction in plan view, and
   the conductive part extends in a second direction crossing the first direction in plan view.

4. The display device according to claim 1, wherein
   an end side surface of the opening of the auxiliary conductive layer is inclined and a width of the contact hole becomes gradually small toward a direction separating from the substrate.

5. The display device according to claim 1, further comprising a light-emitting layer positioned between the pixel electrode and the common electrode and disposed across the first pixel and the contact area, wherein
   the light-emitting layer is broken at a side wall of the contact hole.

6. The display device according to claim 1, wherein
   the contact hole includes a plurality of contact holes, and
   the plurality of the contact holes are provided in the contact area.

7. The display device according to claim 1, further comprising:
   a first main pixel including the first pixel and the contact area; and
   a second main pixel including a second pixel having a first color equal to a color of the first pixel and a third pixel having a second color different from the color of the second pixel, and being adjacent to the first main pixel, wherein
   a direction from the first pixel to the contact area is equal to a direction from the second pixel to the third pixel in plan view, and
   the second color has a lower visibility than the first color.

8. The display device according to claim 7, wherein
   the second color is blue, and
   the first main pixel does not include a blue pixel.

9. A display device, comprising:
   a display area;
   a plurality of main pixels provided in the display area;
   a common electrode disposed across the plurality of main pixels; and
   an auxiliary conductive layer provided in a layer lower than the common electrode, wherein
   the plurality of main pixels include a first main pixel and a second main pixel,
   the first main pixel includes at least a first color sub-pixel, a second color sub-pixel and a third color sub-pixel which emit lights of colors different from each other,
   the second main pixel includes the first color sub-pixel, the second color sub-pixel, and a contact area where the common electrode and the auxiliary conductive layer are connected, a whole of the contact area positioned in the display area,
   the first main pixel does not include a contact area where the common electrode and the auxiliary conductive layer are connected, and
   the second main pixel does not include the third color sub-pixel.

10. The display device according to claim 9, wherein
    the sub-pixel of the third color is a blue sub-pixel.

11. The display device according to claim 10, wherein
    the first main pixel includes the blue sub-pixel, a red sub-pixel, a green sub-pixel and a white sub-pixel.

12. The display device according to claim 9, further comprising a light-emitting layer, wherein
    one or more layers including the auxiliary conductive layer are provided under the light-emitting layer,
    the common electrode is provided above the light-emitting layer,
    the one or more layers include a contact hole in the contact area,
    an inside side surface of the contact hole includes a reverse taper part in which a width of the contact hole gradually becomes small upwardly, the reverse taper part being composed of the auxiliary conductive layer, and
    the reverse taper part and the common electrode are electrically connected.

13. The display device according to claim 12, wherein
    the contact hole includes a plurality of contact holes, and
    the plurality of the contact holes are provided in the contact area.

14. The display device according to claim 12, wherein
    the one or more layers include the auxiliary conductive layer and an insulating layer provided under the auxiliary conductive layer,
    the insulating layer includes a hole opening upwardly,
    the hole includes two side surfaces which face each other and an interval of which becomes large upwardly,
    the auxiliary conductive layer includes an opening at a position corresponding to the hole of the insulating layer, and an edge of the opening of the auxiliary conductive layer is positioned on the two side surfaces of the hole.

15. The display device according to claim 14, further comprising a pixel electrode provided in each of the plurality of sub-pixels, wherein
the pixel electrode is provided between the light-emitting layer and the auxiliary conductive layer and contacts the light-emitting layer, and
the edge of the opening of the auxiliary conductive layer is covered with a conductive part provided in a same layer as the pixel electrode.

16. The display device according to claim 15, wherein
the edge of the opening of the auxiliary conductive layer extends in a first direction in plan view, and
the conductive part provided in the same layer as the pixel electrode extends in a second direction crossing the first direction in plan view.

17. A display device comprising:
a first pixel positioned in a display area;
a bank layer surrounding an outer periphery of the first pixel;
a contact area adjacent to the first pixel through the bank layer, a whole of the contact area positioned in the display area;
a pixel electrode provided in the first pixel;
a common electrode disposed across the first pixel and the contact area;
an auxiliary conductive layer at least a part of which is positioned in the contact area;
a contact hole provided in the contact area and electrically connecting the common electrode and the auxiliary conductive layer;
a first main pixel including the first pixel and the contact area; and
a second main pixel including a second pixel having a first color equal to a color of the first pixel and a third pixel having a second color different from the color of the second pixel, and being adjacent to the first main pixel, wherein
a direction from the first pixel to the contact area is equal to a direction from the second pixel to the third pixel in plan view, and
the second color has a lower visibility than the first color.

18. The display device according to claim 17, wherein
the second color is blue, and
the first main pixel does not include a blue pixel.

* * * * *